(12) United States Patent
Chan

(10) Patent No.: US 10,236,871 B2
(45) Date of Patent: Mar. 19, 2019

(54) PULSE WIDTH FILTERING CIRCUIT

(71) Applicant: Mosway Technologies Limited, Hong Kong (CN)

(72) Inventor: On Bon Peter Chan, Hong Kong (CN)

(73) Assignee: Mosway Technologies Limited, Hong Kong SAR (CN)

( * ) Notice: Subject to any disclaimer, the term of this patent is extended or adjusted under 35 U.S.C. 154(b) by 0 days.

(21) Appl. No.: 15/795,366

(22) Filed: Oct. 27, 2017

(65) Prior Publication Data

US 2018/0123576 A1 May 3, 2018

Related U.S. Application Data

(60) Provisional application No. 62/414,051, filed on Oct. 28, 2016.

(51) Int. Cl.
| | |
|---|---|
| *H03K 5/156* | (2006.01) |
| *H03K 5/134* | (2014.01) |
| *H03K 5/1534* | (2006.01) |
| *H03K 17/00* | (2006.01) |
| *H03K 19/20* | (2006.01) |

(52) U.S. Cl.
CPC .......... *H03K 5/1565* (2013.01); *H03K 5/134* (2014.07); *H03K 5/1534* (2013.01); *H03K 17/005* (2013.01); *H03K 19/20* (2013.01)

(58) Field of Classification Search
CPC .................................................. H03K 5/1565
See application file for complete search history.

(56) References Cited

U.S. PATENT DOCUMENTS

| | | | | |
|---|---|---|---|---|
| 5,546,434 A | * | 8/1996 | Kalafatis | ................. H03L 7/085 331/1 A |
| 6,559,699 B2 | * | 5/2003 | Lee | .......................... H03K 5/13 327/269 |

* cited by examiner

*Primary Examiner* — Daniel Puentes
(74) *Attorney, Agent, or Firm* — Leydig, Voit & Mayer

(57) ABSTRACT

A pulse width filtering circuit for filtering pulse signals includes an input transition detection circuit detecting change of state of an input signal, including a first transition from a low signal to a high signal and a second transition from the high signal to the low signal; a first delay circuit determining whether the high signal from the first transition is maintained longer than a first period and, if so, generating a first output indicative of the first transition, after the first period; a second delay circuit determining whether the low signal from the second transition is maintained for longer than a second period and, if so, generating a second output indicative of the second transition, after the second period; and a switching circuit connected to the first and second delay circuits and selectively outputting the first output and the second output, based on the state of the input signal.

12 Claims, 4 Drawing Sheets

PULSE WIDTH FILTERING CIRCUIT

TECHNICAL FIELD

The invention relates to a pulse width filtering circuit, i.e., a filter circuit for processing or filtering pulse signals (input signals in the form of pulses).

BACKGROUND

Electronic circuits are prone to small pulse width signals ("glitches"). These small pulse width signals may be present at the interface of various integrated circuit components in a circuit. The propagation of these signals may have negative impact on circuit operation and performance, and so it is desirable that these signals be filtered, regulated, or controlled.

SUMMARY OF THE INVENTION

In accordance with a first aspect of the invention, there is provided a pulse width filtering circuit, comprising: an input transition detection circuit arranged to detect change of state of an input signal, the change of state comprising a first transition from a low signal to a high signal and a second transition from the high signal to the low signal; and a delay circuit operably connected with the input transition detection circuit, to determine whether the high signal resulting from the first transition is maintained for longer than a predetermined period, or whether the low signal resulting from the second transition is maintained for longer than a predetermined period, and if so, provides an output indicative of the corresponding transition after the predetermined period from the corresponding transition. The input signals are preferably binary, either at the low level or at the high level.

The delay circuit essentially acts to filter signal pulses (both positive and negative) that have shorter duration than a predetermined time value, thereby preventing such relatively short signal pulses from affecting the output and preserving the timing properties of the original input signal. Improved noise immunity can be achieved at the output.

Preferably, the delay circuit comprises: a first delay circuit arranged to determine whether the high signal resulting from the first transition is maintained for longer than a first predetermined period, and if so, provides a first output indicative of the first transition after the first predetermined period from the first transition; and a second delay circuit arranged to determine whether the low signal resulting from the second transition is maintained for longer than a second predetermined period, and if so, provides a second output indicative of the second transition after the second predetermined period from the second transition. The use of first and second delay circuits allows separate control of the respective transitions, thereby improving reliability of the filter circuit.

Preferably, the pulse width filtering circuit further includes a switching circuit operably connected with the first delay circuit and the second delay circuit, to selectively output the first output of the first delay circuit and the second output of the second delay circuit based on the state of the input signal. In other words, the first and second outputs serve as input signals to the switching circuit, which selects one of the two input signals to the output of the pulse width filtering circuit based on the state of the input signal. As a result, at any moment in time, either the output of the first delay circuit or the output of the second delay circuit is taken as the output.

Preferably, the first delay circuit controls the first predetermined period and the second delay circuit controls the second predetermined period. Simple control can be achieved without the need of external circuit components.

Preferably, the first delay circuit comprises a first capacitor, a charging time of which determines the first predetermined period. The first delay circuit may further comprise a first semiconductor device controlled by a control signal to affect the charging time of the first capacitor; or a resistor operably connected with the first capacitor to affect the charging time of the first capacitor.

Preferably, the second delay circuit comprises a second capacitor, a charging time of which determines the second predetermined period. The second delay circuit may further comprise a second semiconductor device controlled by a control signal to affect the charging time of the second capacitor; or a resistor operably connected with the second capacitor to affect the charging time of the second capacitor.

A capacitor is simple, low cost and effective in use. In embodiments in which a control signal is used, the charging time can be flexibly controlled by manipulating the control signal. In embodiments in which a resistor is used, the circuit is relatively simple and low cost.

Preferably, the first predetermined period and the second predetermined period are the same.

Preferably, the first delay circuit and the second delay circuit have the same construction. The circuit symmetry improves circuit balance.

Preferably, the input transition detection circuit comprises one or more logic gates. Logic gates are relatively cheap and have reliable performance.

Preferably, the one or more logic gates comprises a NOR gate and a NAND gate, both arranged to receive the input signal and an output signal of the pulse width filtering circuit as input. By taking both the input signal and the output as input, the change of state can be more reliably determined.

Preferably, the switching circuit comprises a multiplexer.

In accordance with a second aspect of the invention, there is provided a driver circuit comprising the pulse width filtering circuit of the first aspect.

BRIEF DESCRIPTION OF THE DRAWINGS

Embodiments of the invention will now be described, by way of example, with reference to the accompanying drawings in which.

DETAILED DESCRIPTION OF THE PREFERRED EMBODIMENT

Figure 1:
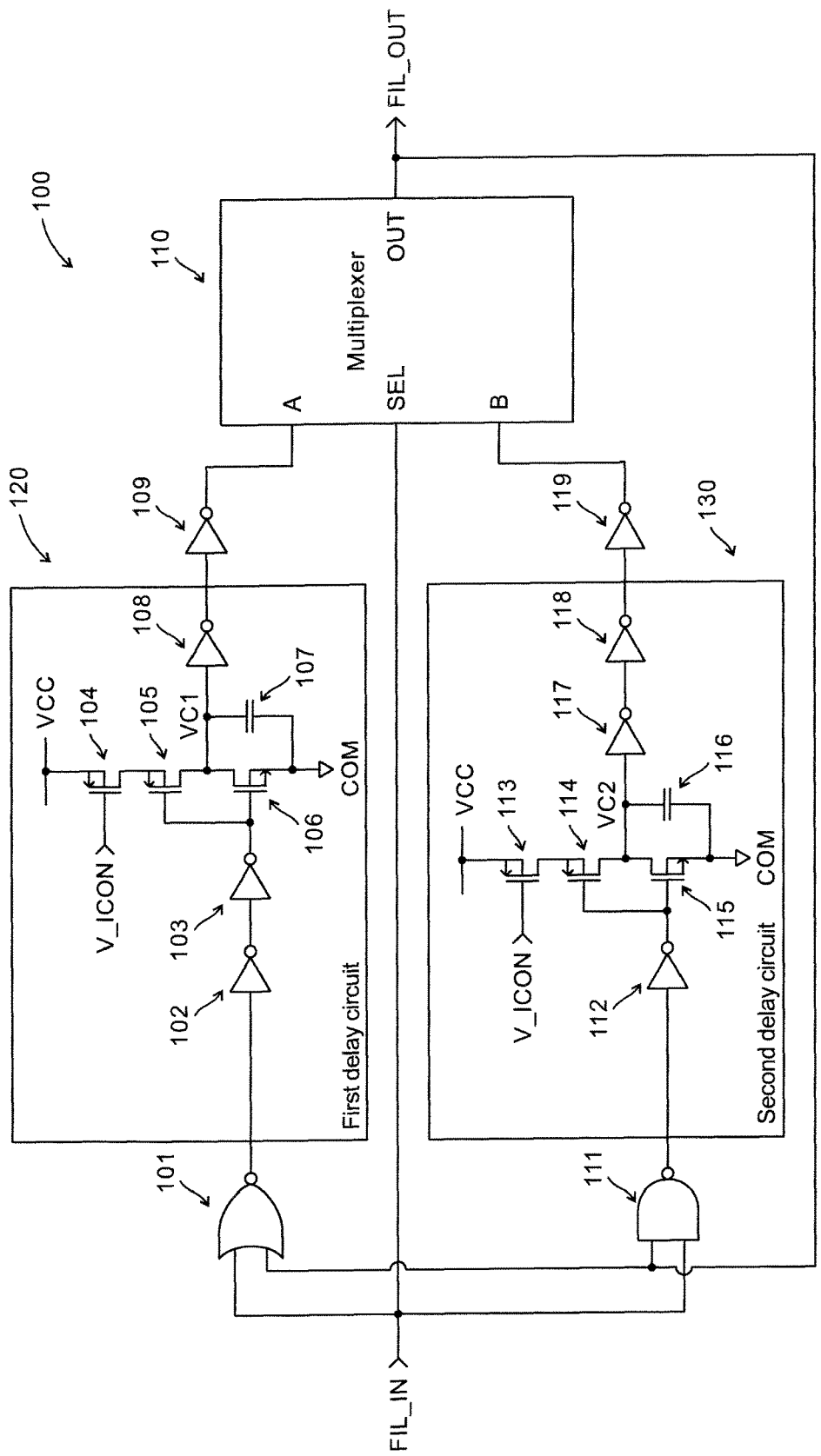
FIG. 1 is a circuit diagram of a pulse width filtering circuit in one embodiment of the invention.

FIG. 1 shows a pulse width filtering circuit 100 in one embodiment of the invention. The pulse width filtering circuit 100 includes an input transition detection circuit arranged to detect change of state (transition from a low signal to a high signal, and vice versa) of an input signal at input FIL_IN, a delay circuit formed by two delay circuits each connected with the input transition detection circuit, and a switching circuit connected with the delay circuits to provide an output at FIL_OUT.

The input transition detection circuit includes a NOR gate 101 and a NAND gate 111, which are arranged to distinguish between rising edge (transition from low level to high level) and falling edge (transition from high level to low level) of the input signal. The NOR gate 101 takes the input signal at FIL_IN and the output signal at FIL_OUT as input. The NAND gate 111 likewise takes the input signal at FIL_IN and the output signal at FIL_OUT as input. The pin of the NAND gate 111 arranged to receive the output signal at FIL_OUT and the pin of the NOR gate 101 arranged to receive the output signal at FIL_OUT are connected with each other.

The delay circuit includes a first delay circuit 120 connected between the NOR gate 101 and input pin A of the multiplexer 110 in the switching circuit for processing signals corresponding to the pulse rising edges; and a second delay circuit 130 connected between the NAND gate 111 and input pin B of the multiplexer 110 for processing signals corresponding to the pulse falling edges.

In this embodiment, the first delay circuit 120 includes two series inverters 102, 103, three MOS devices 104-106 arranged in series between VCC and COM, a capacitor 107 connected across the third NMOS device 106, and another inverter 108. Gate terminal of the PMOS device 104 is arranged to receive control signal V_ICON; source terminal of the PMOS device 104 connects with VCC; drain terminal of the PMOS device 104 connects with source terminal of the adjacent PMOS device 105. Gate terminal of the PMOS device 105 is arranged to connect with gate terminal of the adjacent NMOS device 106 and also the output of the inverter 103; drain terminal of the PMOS device 105 connects with drain terminal of the adjacent NMOS device 106. Source terminal of the NMOS device 106 connects with COM. A node VC1 is defined at the drain terminal of the PMOS devices 105 and NMOS device 106. The input of the inverter 108 connects to VC1. A further inverter 109 is arranged at the output of the inverter 108. The inverter 109 connects with pin A of the multiplexer 110.

In this embodiment, the second delay circuit 130 includes an inverter 112, three MOS devices 113-115 arranged in series between VCC and COM, a capacitor 116 connected across the third NMOS device 115, and two series inverters 117, 118. Gate terminal of the PMOS device 113 is arranged to receive control signal V_ICON; source terminal of the PMOS device 113 connects with VCC; drain terminal of the PMOS device 113 connects with source terminal of the adjacent PMOS device 114. Gate terminal of the PMOS device 114 is arranged to connect with gate terminal of the adjacent NMOS device 115 and also the output of the inverter 112; drain terminal of the PMOS device 114 connects with drain terminal of the adjacent NMOS device 115. Source terminal of the NMOS device 115 connects with COM. A node VC2 is defined at the drain terminal of the PMOS device 114 and the drain terminal of the NMOS device 115. The input of the inverter 117 connects to VC2. The inverter 117 is connected in series with a further inverter 118. A further inverter 119 is arranged at the output of the inverter 118. The inverter 119 connects with pin B of the multiplexer 110.

The switching circuit comprises a multiplexer 110 (i.e., an integrated circuit) with a pair of input pins A and B, a SEL pin, and an output pin OUT. Input pins A and B of the multiplexer 110 are for receiving signals that respectively correspond to the rising edge (transition from low level to high level) and falling edge (transition from high level to low level) of the pulses of an input signal. The two signals that correspond to the rising and falling edges are derived from an input signal FIL_IN received at the filter circuit input, via the NOR gate 101 for the first input pin A of the multiplexer 110 and the NAND gate 111 for the second input pin B of the multiplexer 110. The output pin OUT is arranged to provide an output signal FIL_OUT at the output of the pulse width filtering circuit 100. The SEL pin is connected to the input of the pulse width filtering circuit 100 to receive the input signal FIL_IN, and is used to direct signal at the input pin A to the output pin OUT when the SEL pin is at the high state, and to direct signal at the input pin B to the output pin OUT when the SEL pin is at the low state.

In operation of the circuit 100 in FIG. 1, subsequent to a steady state when the signals at FIL_IN and FIL_OUT are both at the low state, when the input signal FIL_IN changes from low state to high state, the rising edge of the input signal transition is delayed by the first delay circuit 120. This causes the signal at the first input pin A of the multiplexer 110 to change from low state to high state after a first delay time as determined by the first delay circuit 120, provided that the input signal FIL_IN remains at the high state longer than the first delay time.

While the input signal FIL_IN stays at the high state, the multiplexer 110 passes the signal at its first input pin A to its output pin OUT. Hence, the output signal FIL_OUT follows the input rising transition of the input signal FIL_IN, with a delay equal to the delay time of the first delay circuit 120. The delay time of the first delay circuit 120 is determined by the charging time of the capacitor 107 in the delay circuit 120. The charging current is controlled by a control signal V_ICON via the PMOS device 104.

Similarly, when the input signal FIL_IN goes from the high state to low state when the output signal FIL_OUT is at the high state, the falling edge of the input signal FIL_IN is propagated to the second input pin B of the multiplexer 110, with a second delay time determined by the second delay circuit 130, provided that the low state of the input signal FIL_IN lasts for longer than the second delay time. The low state of the input signal FIL_IN then appearing at the second input pin B of the multiplexer 110 is passed onto the output pin OUT.

In general, the output signal FIL_OUT follows the falling transition of the input signal FIL_IN with a delay equal to the delay time provided by the second delay circuit 130. The delay time of the second delay circuit 130 is determined by the charging time of the capacitor 116 of the delay circuit 130. The charging current is controlled by a control signal V_ICON via a PMOS device 113.

If the delay times of the first and second delay circuits 120 and 130 are equal, the output signal FIL_OUT will be a reproduction of the input signal FIL_IN subject to that delay time, without any change or distortion in the signal's mark-to-space ratio.

For a narrow positive-going input pulse, when the input FIL_IN and the output FIL_OUT of the filtering circuit 100 are both at the low state and the pulse period is shorter than the delay time of the first delay circuit 120, the charging up at the circuit node VC1 is unable to reach the threshold of the inverter 108 (a component of the first delay circuit 120) before the end of the input pulse. Hence, the circuit node VC1 will be reset to the low state at the end of the input pulse. In this case, the circuit 100 effectively functions as a filter that prohibits or blocks positive input pulses at the input FIL_IN with a pulse width narrower than the delay time of the first delay circuit 120 from passing through.

Similarly, for a narrow negative-going input pulse, when the input FIL_IN and output FIL_OUT of the filtering circuit 100 are both at the high state and the pulse period is shorter than the delay time of the second delay circuit 130, the charging up at the circuit node VC2 is unable to reach the threshold of the inverter 117 (a component of the second delay circuit 130) before the end of the input pulse. Hence, the circuit node VC2 will be reset to the high state at the end of the input pulse. In this case, the circuit 100 effectively functions as a filter that prohibits or stops negative input pulses at the input FIL_IN with a pulse width narrower than the delay time of the second delay circuit 130 from passing through.

Figure 2:
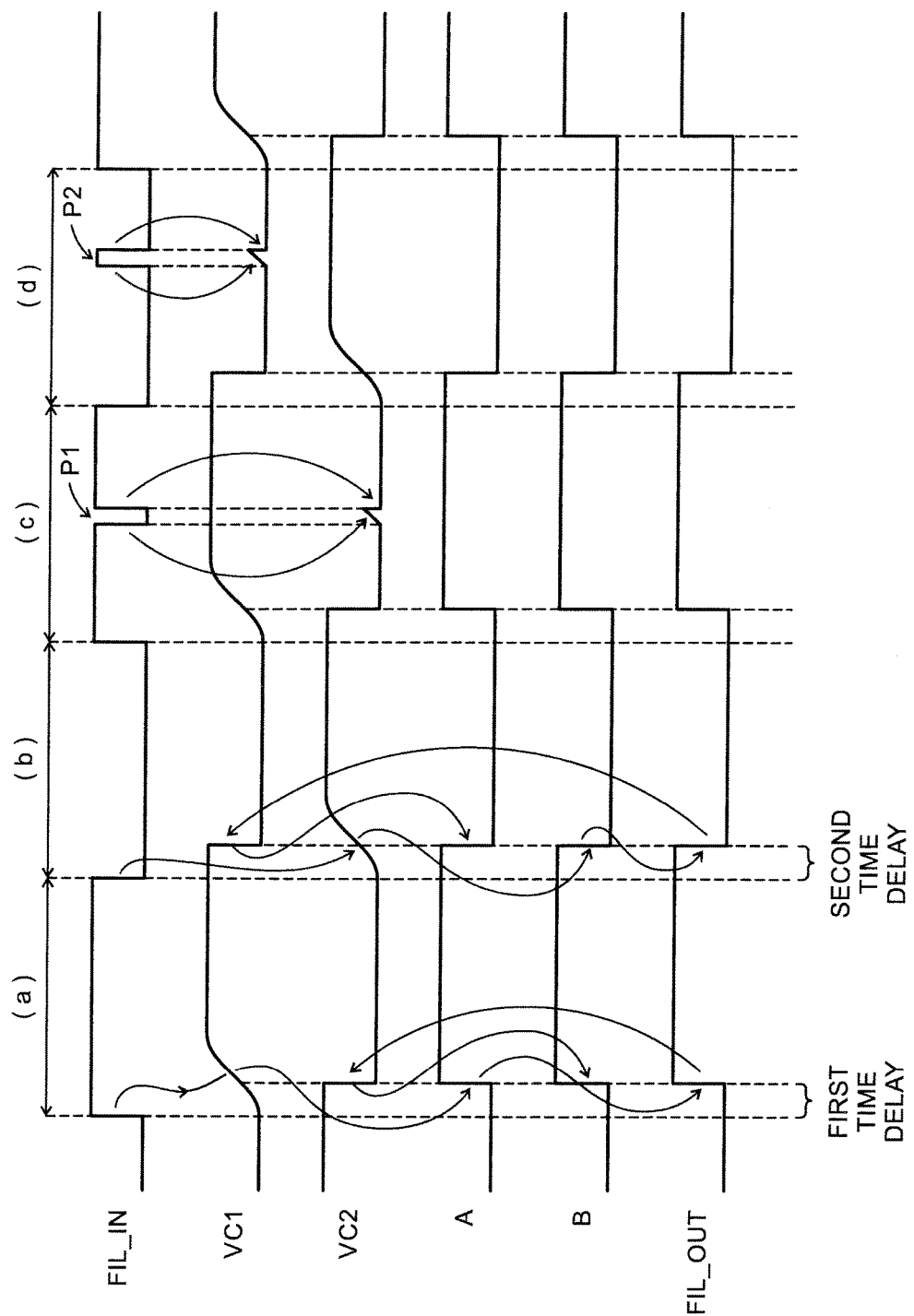
FIG. 2 is a graph showing waveforms representing signals at various nodes of the pulse width filtering circuit of FIG. 1.

FIG. 2 illustrates the timing waveforms of the filtering circuit 100 at its essential circuit nodes. It can be observed that the sequential time periods (a), (b), (c) and (d) in the input signal FIL_IN are preserved in the output signal FIL_OUT due to the fact that they are longer than the delay times of the first delay circuit 120 and the second delay circuits 130. The reason is apparent from the foregoing description.

For example, the rising edge of the input signal FIL_IN during the time period (a) triggers charging up at the circuit node VC1 in the first delay circuit 120. Since the time period (a) is longer than the rising edge delay time provided by the first delay circuit 120, the charging signal at the circuit node VC1 in the first delay circuit 120 will exceed the threshold of the inverter 108, thereby making the signal at the first input pin A of the multiplexer 110, and in turn the output signal FIL_OUT, to change from low state to high state. The output signal FIL_OUT will subsequently reset the circuit node VC2 in the second delay circuit 130 to the low state, with the result that the second input pin B of the multiplexer 110 is also set to the high state.

At the end of the time period (a), i.e., at the beginning of the second time period (b), the falling edge of the input signal FIL_IN will trigger charging up at the other circuit node VC2 in the second delay circuit 130. Since the second time period (b) is longer than the falling edge delay time provided by the second delay circuit 130, the charging signal at the circuit node VC2 in the second delay circuit 130 will exceed the threshold of the inverter 117, thereby making the signal at the second input pin B of the multiplexer 110, and in turn the output signal FIL_OUT, to change from high to low state. Subsequently, the output signal FIL_OUT will reset the circuit node VC1 in the first delay circuit 120 to the low state, with the result that the first input pin A of the multiplexer 110 is also set to the low state.

With regard to the third time period (c), since the time from the first rising edge of the input signal FIL_IN to the falling edge of a narrow negative pulse P1 (which represents a negative noise glitch appearing in the middle of the time period (c)) is longer than the delay time of the first delay circuit 120, the output signal FIL_OUT will change from low state to high state, with a time delay introduced by the first delay circuit 120.

As the width of the narrow negative pulse P1 is shorter than the delay time of the second delay circuit 130, the signal at circuit node VC2 in the second delay circuit 130 will not be able to charge up to reach the threshold of the inverter 117 of the second delay circuit 130 before it is reset by the rising edge of the narrow pulse P1. Hence, this narrow pulse P1 does not pass through the filtering circuit 100 to reach the output FIL_OUT, so the filtering circuit output FIL_OUT will remain high. The narrow pulse P1 is thus filtered out.

Similarly, during the time period (d), since the time from the first falling edge of the input signal FIL_IN to the rising edge of a narrow positive pulse P2 (which represents a positive noise glitch appearing in the middle of the time period (d) is longer than the delay time of the second delay circuit 130, the output signal FIL_OUT will change from high to low state, with a time delay caused by the second delay circuit 130.

Due to the width of the narrow positive pulse P2 being shorter than the delay time of the first delay circuit 120, the signal at the circuit node VC1 in the first delay circuit 120 will not have sufficient time to charge up to the threshold of the inverter 108 of the first delay circuit 120 before it is reset by the falling edge of the narrow pulse P2. Hence, this narrow pulse P2 does not pass through the filtering circuit 100 to the output FIL_OUT, so the filter output FIL_OUT will stay at low. This narrow pulse P2 is also filtered out.

It is noted that each of the first delay circuit 120 and the second delay circuit 130 shown in FIG. 1 utilizes a current source at the VCC side to charge up a capacitor 107/116 connected between the control nodes VC1/VC2 and COM for timing control. In a different preferred embodiment, it is possible to make use of an alternative or different circuit for timing control, e.g., based on a current source at the COM side to discharge a capacitor connected between the control nodes VC1/VC2 and COM.

Figure 3:
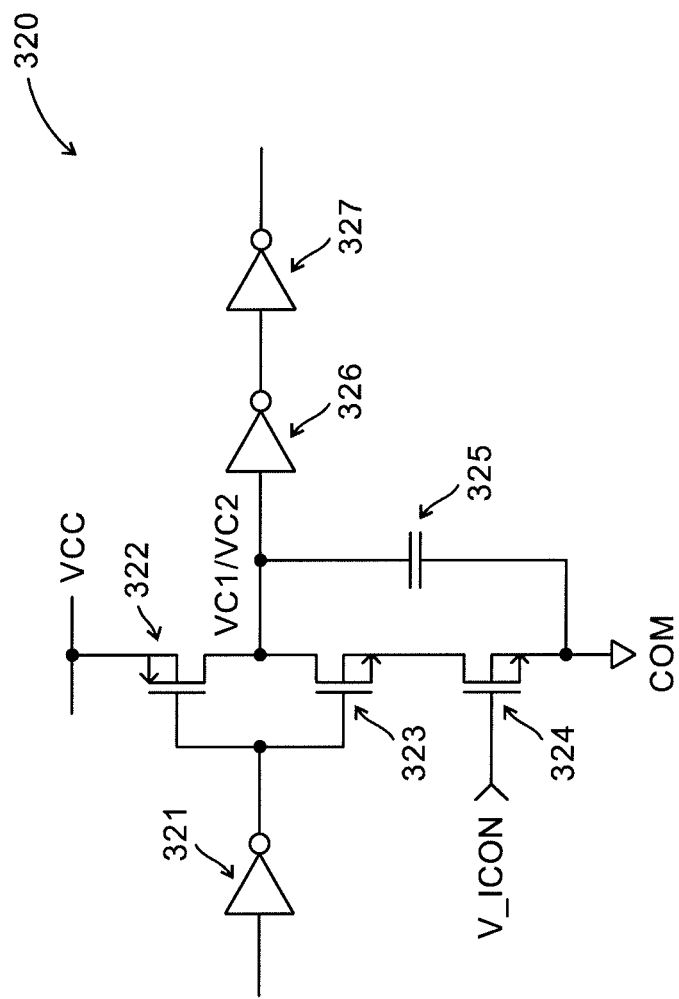
FIG. 3 is a circuit diagram of an alternative delay circuit suitable for use in the filtering circuit in FIG. 1 in one embodiment of the invention.
Figure 4:
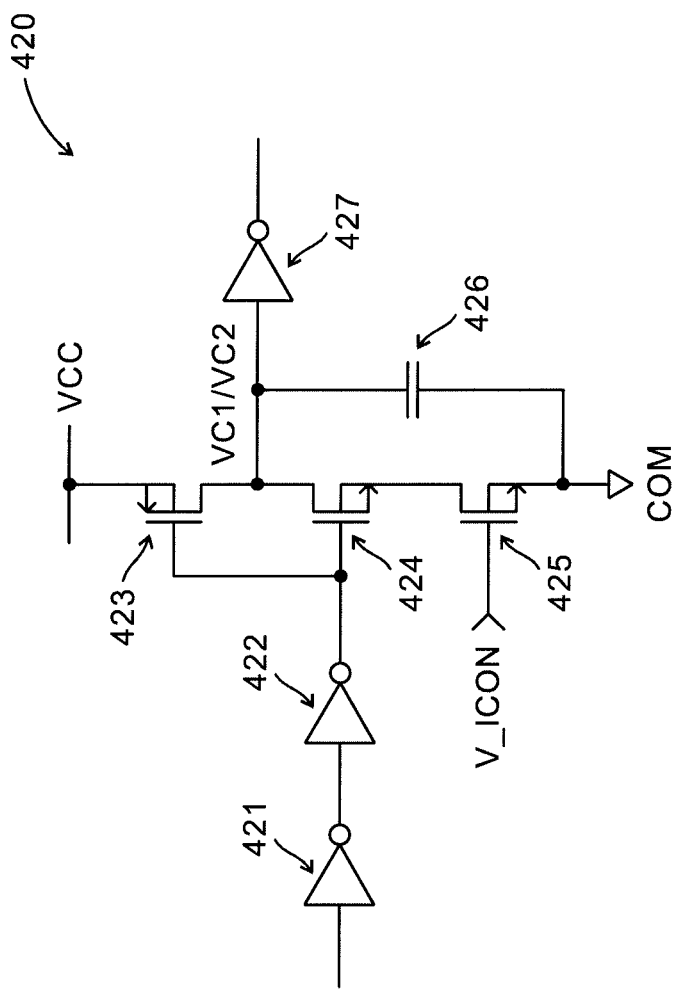
FIG. 4 is a circuit diagram of another alternative delay circuit suitable for use in the filtering circuit in FIG. 1 in one embodiment of the invention.

FIGS. 3 and 4 illustrate alternative delay circuit embodiment for implementing either of the first and second delay circuits 120 and 130 the circuit of FIG. 1.

As shown in FIG. 3, the delay circuit 320 includes an inverter 321, three MOS devices 322-324, a capacitor 325 connected in parallel across two of the NMOS devices 323, 324, and two series inverters 326, 327. The gate terminal of the PMOS device 322 is connected with the gate terminal of the NMOS device 323 and the output of the inverter 321; the drain terminal of the PMOS device 322 is connected with a drain terminal of the adjacent NMOS device 323; the source terminal of the PMOS device 322 is connected with VCC. The source terminal of the NMOS device 323 is connected with a drain terminal of the adjacent NMOS device 324. The gate terminal of the NMOS device 324 is connected with the control signal V_ICON. The source terminal of the NMOS device 324 is connected with COM. Node VC1, VC2 is defined at the drain terminal of the PMOS device 322 and drain terminal of the NMOS device 323. The input of the inverter 326 connects to VC1, VC2. A further inverter 327 is arranged at the output of the inverter 326.

As shown in FIG. 4, the delay circuit 420 includes two series inverters 421, 422, three MOS devices 423-425, a capacitor 426 connected in parallel across two of the NMOS devices 424, 425, and an inverter 427. The gate terminal of the PMOS device 423 is connected with the gate terminal of the NMOS device 424 and also the output of the inverter 422; the drain terminal of the PMOS device 423 is connected with a drain terminal of the adjacent NMOS device 424; the source terminal of the PMOS device 423 is connected with VCC. The source terminal of the NMOS device 424 is connected with a drain terminal of the adjacent NMOS device 425. The gate terminal of the NMOS device 425 is connected with the control signal V_ICON. The source terminal of the NMOS device 425 is connected with COM. Node VC1, VC2 is defined at the drain terminals of the PMOS device 423 and NMOS device 424. The input of the inverter 427 connects to VC1, VC2.

It will be appreciated by persons skilled in the art that further variations and/or modifications may be made to the described embodiments to provide further embodiments of the invention. For example, the input transition detection circuit may be implemented with other logic gates, e.g., the NAND gate and the NOR gate can each be replaced by one or more logic gates that provide the same logic results. Any other suitable circuit configurations may be used to build the delay circuits 120 and 130, or to achieve the time delaying effect. For example, a resistor can be used to replace the current control devices (i.e. the MOS devices 104 and 113) for controlling the charging time constant at the circuit nodes VC1 and VC2. It should also be noted that a capacitor may be connected between the node VCC and the node VC1/VC2 as an alternative circuit to achieve the same function. Also, other semiconductor switches may be used in place of the MOS devices. The embodiments as described here are to be considered in all respects illustrative, not restrictive.

The invention claimed is:

1. A pulse width filtering circuit, comprising:
    an input transition detection circuit arranged to detect a change of state of an input signal, wherein the change of state includes a first transition from a low signal to a high signal, and a second transition from the high signal to the low signal, wherein the input transition detection circuit comprises
        a NOR gate arranged to receive the input signal of the pulse width filtering circuit and an output signal of the pulse width filtering circuit as inputs, and
        a NAND gate arranged to receive the input signal of the pulse width filtering circuit and the output signal of the pulse width filtering circuit as inputs;
    a first delay circuit arranged to determine whether the high signal resulting from the first transition is maintained for longer than a first predetermined period, and, if so, outputting a first output indicative of the first transition, after the first predetermined period elapses following the first transition;
    a second delay circuit arranged to determine whether the low signal resulting from the second transition is maintained for longer than a second predetermined period, and, if so, outputting a second output indicative of the second transition, after the second predetermined period elapses following the second transition; and
    a switching circuit operably connected to the first delay circuit and to the second delay circuit, and selectively outputting the first output of the first delay circuit and the second output of the second delay circuit, based on the state of the input signal.

2. The pulse width filtering circuit in accordance with claim 1, wherein
    the first delay circuit controls the first predetermined period, and
    the second delay circuit controls the second predetermined period.

3. The pulse width filtering circuit in accordance with claim 1, wherein the first delay circuit comprises a capacitor having a charging time which determines the first predetermined period.

4. The pulse width filtering circuit in accordance with claim 3, wherein the first delay circuit further comprises a semiconductor device controlled by a control signal to alter the charging time of the capacitor.

5. The pulse width filtering circuit in accordance with claim 3, wherein the first delay circuit further comprises a resistor operably connected to the capacitor to alter the charging time of the capacitor.

6. The pulse width filtering circuit in accordance with claim 1, wherein the second delay circuit comprises a capacitor having a charging time which determines the second predetermined period.

7. The pulse width filtering circuit in accordance with claim 6, wherein the second delay circuit further comprises a semiconductor device controlled by a control signal to alter the charging time of the capacitor.

8. The pulse width filtering circuit in accordance with claim 6, wherein the second delay circuit further comprises a resistor operably connected to the capacitor to alter the charging time of the capacitor.

9. The pulse width filtering circuit in accordance with claim 1, wherein the first predetermined period and the second predetermined period are the same.

10. The pulse width filtering circuit in accordance with claim 1, wherein the first delay circuit and the second delay circuit have the same construction.

11. The pulse width filtering circuit in accordance with claim 1, wherein the switching circuit comprises a multiplexer.

12. A driver circuit comprising the pulse width filtering circuit of claim 1.

* * * * *